United States Patent [19]

Eto

[11] Patent Number: 4,901,272

[45] Date of Patent: Feb. 13, 1990

[54] VARIABLE PHASE COMPENSATING APPARATUS

[75] Inventor: Masahiko Eto, Tokyo, Japan

[73] Assignee: Leader Electronics Corp., Yokohama, Japan

[21] Appl. No.: 226,351

[22] Filed: Jul. 29, 1988

[30] Foreign Application Priority Data

Jul. 31, 1987 [JP] Japan .................. 62-192420

[51] Int. Cl.⁴ .................. H02M 5/16; H02M 7/00
[52] U.S. Cl. .................. 364/857; 364/807
[58] Field of Search .................. 364/857, 807, 602; 328/145

[56] References Cited

U.S. PATENT DOCUMENTS

| | | | |
|---|---|---|---|
| 3,805,046 | 4/1974 | Magnussen, Jr. | 364/857 |
| 3,965,344 | 6/1976 | Romo | 364/857 |
| 4,004,141 | 1/1977 | Curtis | 364/857 |
| 4,065,682 | 12/1977 | Evans | 364/857 X |
| 4,300,203 | 11/1981 | Brown | 364/857 X |
| 4,356,449 | 10/1982 | Thomas | 364/857 X |
| 4,385,364 | 5/1983 | Main | 364/857 |
| 4,532,604 | 7/1985 | Baker | 364/857 X |

OTHER PUBLICATIONS

IC op-amp Cookbook by Walter G. Jung, pp. 209–218: Section 5.12 "Logarithmic Converters", 1974.
Nonlinear Circuits Handbook by Analog Devices, pp. 165–201: Section III, Feb. 1974.

Primary Examiner—Michael R. Fleming
Attorney, Agent, or Firm—Biebel, French & Nauman

[57] ABSTRACT

A circuit arrangement is provided for phase compensation for a feedback amplifier circuit which has a variable gain depending upon the level of an input, so that a broadened frequency range in which the gain is substantially constant with respect to any given level of the input is attained. Also, logarithmic converter circuits in which such phase compensation is performed are provided.

13 Claims, 6 Drawing Sheets

VARIABLE PHASE COMPENSATING APPARATUS

FIELD OF THE INVENTION

The present invention relates to a variable phase compensating apparatus which variably compensates for the phase shift of a feedback amplifier circuit, such as a logarithmic converting circuit, which has frequency characteristics on gain and phase varying as the gain changes.

PRIOR ART

Figure 6:
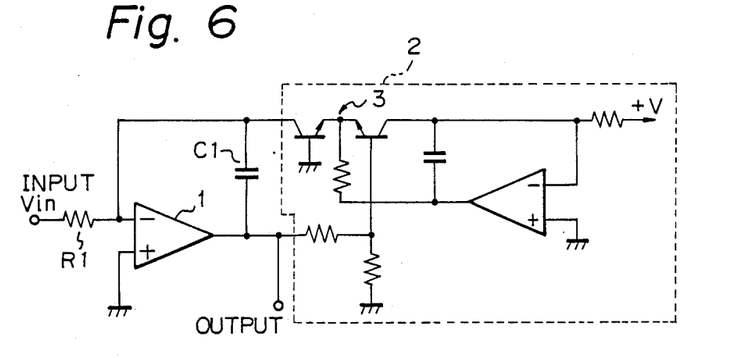
FIG. 6 is a schematic diagram of a conventional logarithmic converter circuit.

Conventional logarithmic converter circuits include, as shown in FIG. 6, an operational amplifier 1 having a non-inverting input terminal connected to an input resister R1, a negative feedback circuit 2 connected between the output terminal and the non-inverting input terminal of the operational amplifier 1, and a fixed phase-compensating capacitor C1 connected in parallel with the feedback circuit 2. The feedback circuit 2 functions as a variable impedance, the value of which varies as the level at the output terminal changes, and the circuit 2 combined with the input resister R1 serves to logarithmically decrease the gain of the operational amplifier 1 as the level of an input signal increases.

Figure 7:
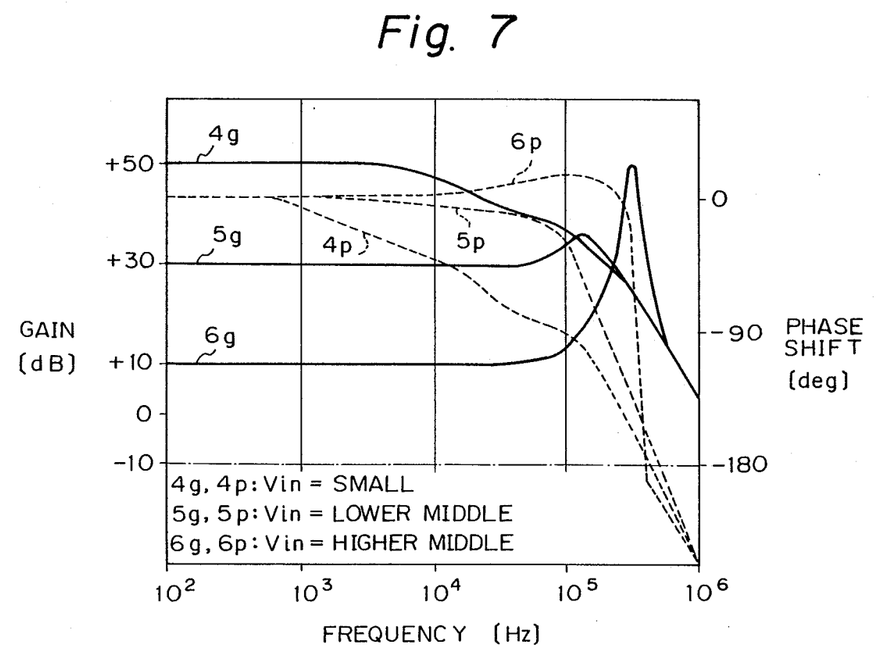
FIG. 7 is a Bode diagram illustrating frequency characteristics on gain and phase of the conventional logarithmic converter circuit of FIG. 6 with the capacitor C1 being omitted.

As shown, the feedback circuit 2 includes a common-base pair transistor 3 which is an active element and has frequency characteristics and also in which a slight current amplification is found. Thus, the circuit of FIG. 6 without the capacitor C1 has frequency characteristics in terms of the gain and the phase as shown in the Bode diagram of FIG. 7. In this Bode diagram, solid lines indicate gain curves, and dotted lines indicate phase curves. Also, 4g and 4p, 5g and 5p, and 6g and 6p designate gain and phase curves in the condition when an input voltage Vin is small (e.g. 1 mV), lower middle (e.g.10 mV) and higher middle (e.g. 100 mV), respectively. In the Bode diagram, even when the input voltage Vin is small, the gain characteristics have a substantially flat portion extending up to between $10^3$ Hz and $10^4$ Hz, as seen from the curve 4g, while if Vin is increased to "large" (not shown), the circuit oscillates. In addition, the gain is still zero dB or more when the phase shift is beyond $-180°$, indicating no phase margin.

Figure 8:
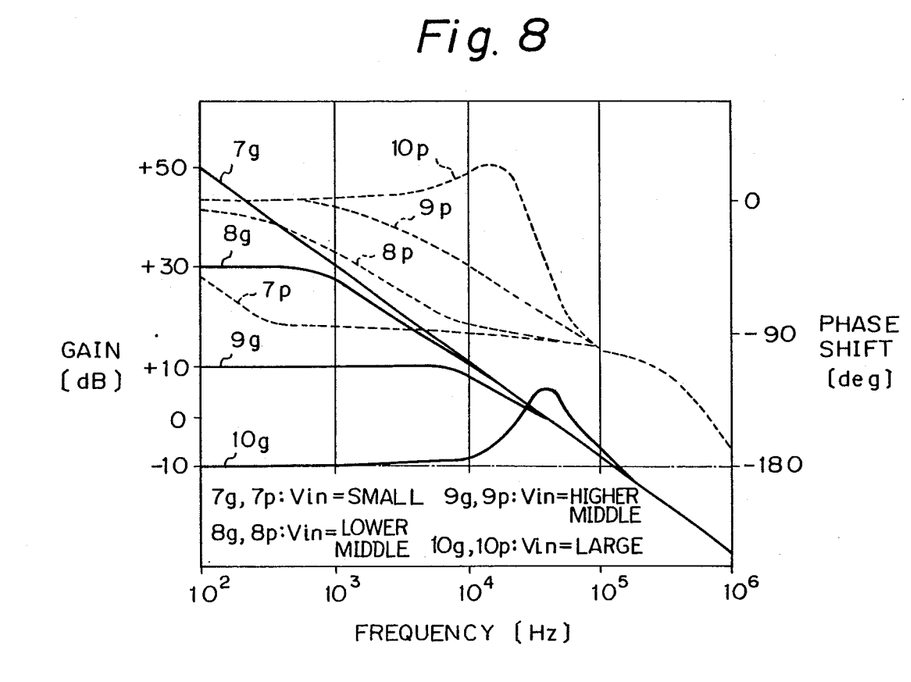
FIG. 8 is a Bode diagram illustrating frequency characteristics on gain and phase of the conventional logarithmic converter circuit of FIG. 6.

To date therefore the capacitor C1 is added for the phase compensation as shown in FIG. 6 so that the phase margin is improved. In this case, the gain characteristics and the phase characteristics are shown in the Bode diagram of FIG. 8 wherein 7g and 7p, 8g and 8p, 9g and 9p, and 10g and 10p designate gain and phase curves in the condition of Vin=small (e.g. 1 mV), lower middle (e.g. 10 mV), higher middle (e.g. 100 mV) and large (e.g. 1 V), respectively. As seen from this, the circuit does not oscillate due to enough phase margin. However, as the level of the input voltage decreases (or the gain increases), the gain characteristics will become significantly degraded, as shown by the transition from the curve 10g to the curve 7g, such that the flat portion of the gain characteristics at the condition of the input voltage Vin=small only exists below $10^2$ Hz.

Figure 9:
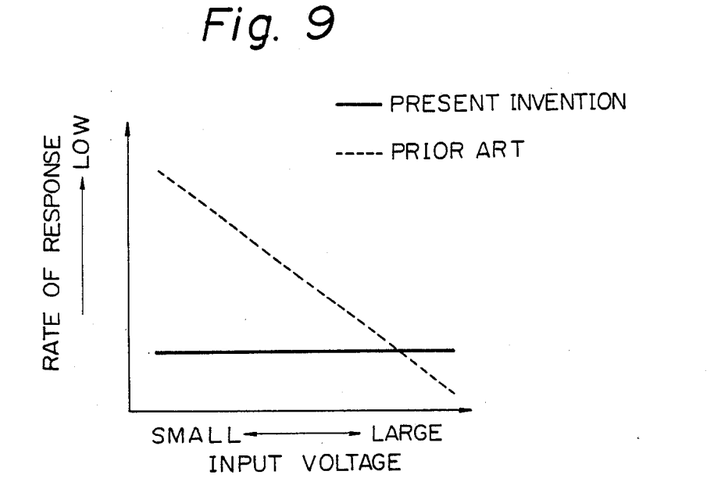
FIG. 9 is a graph showing the relationship between an input voltage and a rate of response as to the circuits of the embodiments shown in FIGS. 2, 4 and 5 of the present invention, in contrast to the conventional circuit of FIG. 6.
Figure 10:
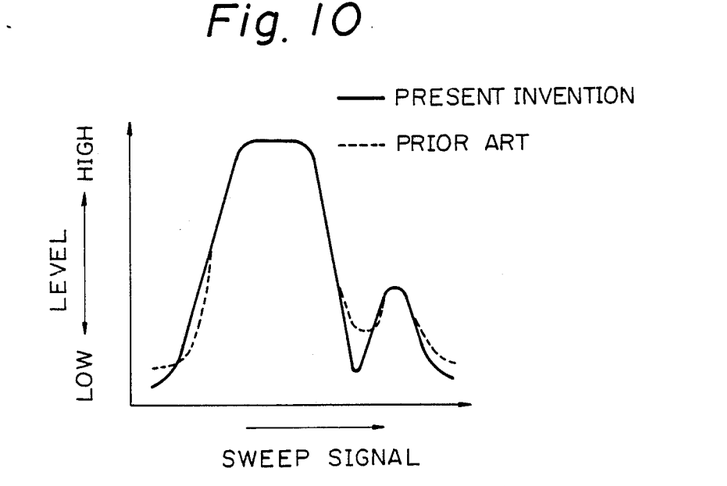
FIG. 10 is a graph illustrating frequency characteristics of an object measured by using the logarithmic converter circuit of the present invention and the conventional logarithmic converter circuit, respectively, which frequency characteristics are observed when a sweep signal from a sweep generator is applied to the measured object and a desired signal from the resulting output is detected and passed through the respective logarithmic converter circuit and then displayed on an oscilloscope.

The above mentioned logarithmic converter circuit, therefore, suffers from the problem that the circuit does not follow rapid changes of voltage, because the rate of response of the circuit slows down as the input voltage becomes small, as shown by the dotted line in FIG. 9. Because of this, when a signal having relatively high frequencies is applied to the converter circuit, for example, in the case when the frequency characteristics (or characteristics having relatively complexed changes) of an object are measured by applying a sweep signal from a sweep generator to the measured object, detecting a desired signal from the resulting output and passing it through the logarithmic converter circuit to be displayed on an oscilloscope, the displayed curve as shown in FIG. 10 is produced wherein traces at lower levels are designated by the dotted line, resulting in inaccurate displays.

The object of the present invention, therefore, is to provide a variable phase compensating apparatus which is used with a feedback amplifier circuit such as a logarithmic converter circuit, in which the gain varies as the level of an input signal changes, which would cause the rate of response to vary accordingly, so that a substantially constant rate of response may be established over a wider dynamic range of the input signal.

SUMMARY OF THE INVENTION

Figure 1:
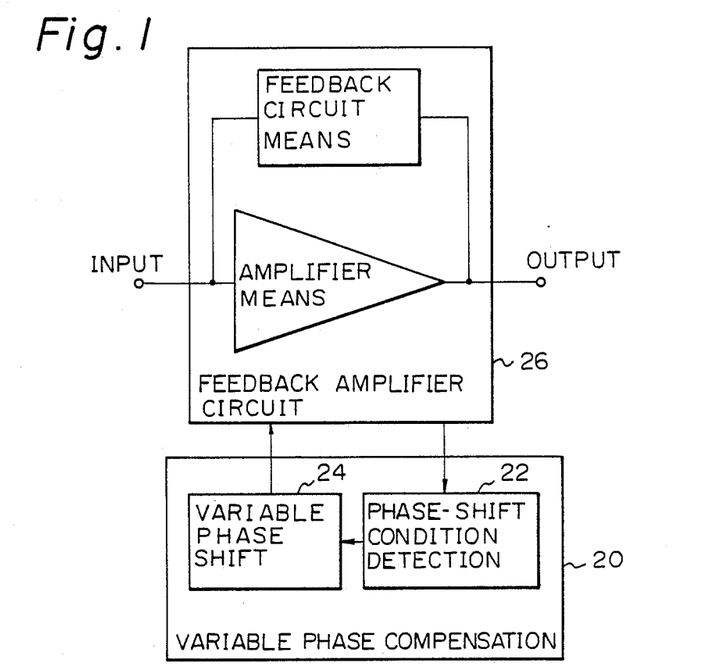
FIG. 1, is a block diagram illustrating the basic structure of the variable phase compensating apparatus according to the present invention.

The above mentioned object is achieved by the present invention which provides, as seen from the basic structure shown in FIG. 1, a variable phase compensating apparatus 20 in a feedback amplifier 26 which is controlled in gain to amplify an input signal by a gain varying with the level of the input signal to generate an output signal and which has frequency characteristics on gain and phase varying in accordance with the change of the gain. The variable phase compensating apparatus 20 includes a phase-shift condition detecting means 22 which detects the level of the input signal to generate a signal defining an amount of phase shift depending upon the detected level; and a variable phase shifting means 24 which is connected in the signal path of the feedback amplifier circuit 26. The phase shifting means 24 is operative to phase shift a signal in said signal path by an amount corresponding to said signal defining the amount of phase shift so that the frequency range in which the gain is substantially constant with respect to the input signal having any given level within the range of varied level of the input signal is broadened.

The variable phase compensating apparatus arranged in such a manner, operates to detect the continuous changing of the level of an input signal applied to the feedback amplifying circuit, and to continuously vary the amount of phase compensation of the feedback amplifying circuit in response to the continuous changing level, thereby widening the frequency range in which substantially constant frequency characteristics are derived over the range of the varying level of the input signal.

The present invention will be more fully described hereinafter with reference to the embodiments of the present invention and the associated drawings.

EMBODIMENTS

Now, an embodiment of a logarithmic converter circuit to which a variable phase compensating apparatus is applied in accordance with the present invention, will be described with reference to the drawings.

Figure 2:
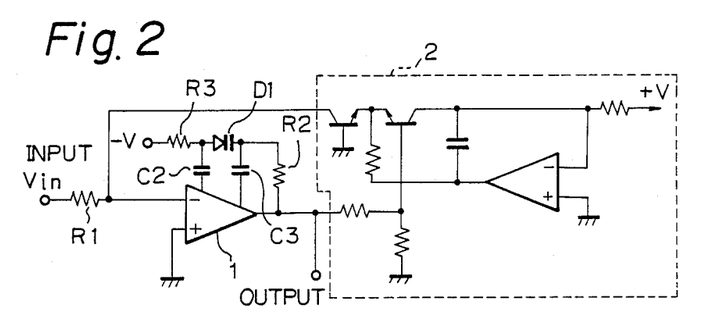
FIG. 2 is a schematic diagram of an embodiment of a logarithmic converter circuit to which the variable phase compensating apparatus is applied in accordance with the present invention.

FIG. 2 shows the schematic diagram of the first embodiment of the logarithmic converter circuit which is the type performing the phase compensation of an operational amplifier itself.

As seen from the figure, the circuit of FIG. 2 is different from the conventional circuit of FIG. 6 in that the fixed capacitor C1 is replaced with a series of a capacitor C2, a variable capacitance diode D1 and a capacitor C3 connected between the phase compensation terminals of an operational amplifier 1. The variable capacitance diode D1 is connected between the output terminal of the operational amplifier 1 and −V voltage supply through the resisters R2 and R3.

Specifically, the feedback circuit 2 detects the level of an input voltage by means of the level of the output voltage of the operational amplifier 1 and the circuit 2 functions as a variable impedance, as described above, the value of which varies in response to the detected level so that a logarithmic output is obtained. The variable impedance in combination with the resister R1 at the non-inverting input of the operational amplifier 1, serves to modify the gain setting of the amplifier 1. Thus, as the level of an input voltage continuously changes, the value of the variable impedance continuously varies to alter the gain setting in a continuous manner. When the gain setting is altered, the gain characteristics and the phase characteristics of the converter circuit change accordingly.

Thus, the resisters R2, R3 and −V voltage supply constitute the phase-shift detecting means mentioned above, in which as the voltage level of the output terminal falls (or the level of the input voltage rises and also the value of the variable impedance becomes low), a bias voltage to the diode D1 is varied to increase the capacitance of the diode D1. This variable capacitance diode D1 and the capacitor C2 and CS constitute the variable phase shifting means mentioned above, which operates to increase the amount of phase shift or amount of phase compensation of a signal in the operational amplifier 1 as the capacitance of the diode D1 becomes larger.

Figure 3:
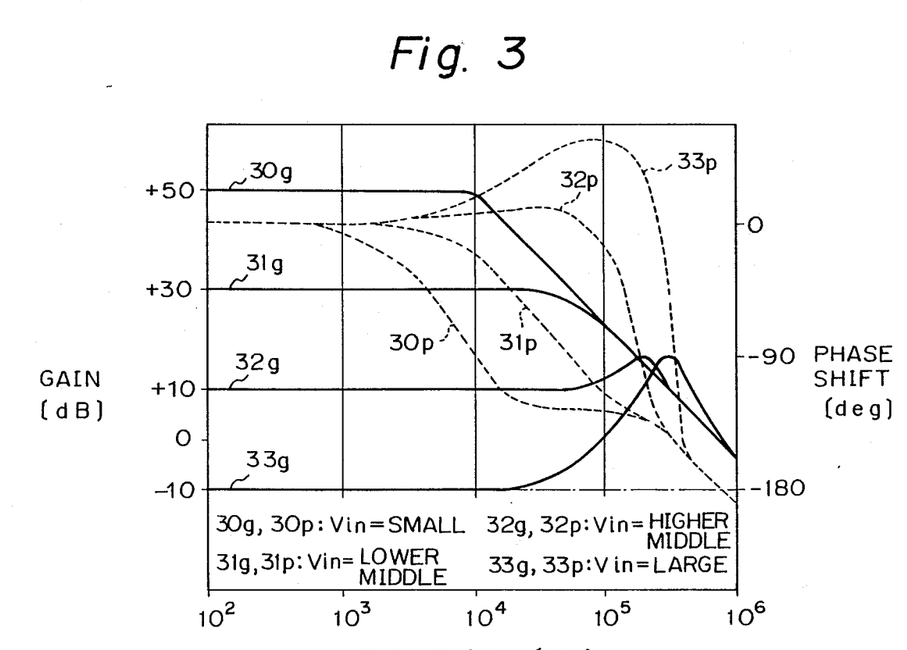
FIG. 3 is a Bode diagram illustrating frequency characteristics on gain and phase of the logarithmic converter circuit shown in FIG. 2.

FIG. 3 shows the Bode diagram for the logarithmic converter circuit of FIG. 2. In the Bode diagram, the frequency characteristics of gain are shown in solid lines while the frequency characteristics of phase are shown in dotted line. Also, curves 30g and 30p, 31g and 31p, 32g and 32p, and 33g and 33p designate the characteristics at the condition when the input voltage Vin is small (e.g. 1 mV), lower middle (e.g. 10 mV), higher middle (e.g. 100 mV) and large (e.g. 1 V), respectively. As seen from the diagram, the gain characteristics have a range wherein a flat portion extends up to $10^4$ Hz even in the condition wherein the input voltage Vin=small (i.e. curve 30g). Thus, the range of constant gain extends to $10^4$ Hz whatever level the input voltage has. Also, some degree of phase margin is assured as shown in the curves 30p through 33p. It should be noted that the width of the variation of the capacitance of the variable capacitance diode D1 may be so selected that certain degree of phase margin enough to prevent any oscillation of the circuit is provided at the maximum and minimum values of the capacitance.

Because of this, the logarithmic converter circuit of FIG. 2 exhibits a rate of response which is substantially constant with respect to the possible levels of the input voltage, as shown in the solid line in FIG. 9. This enables the logarithmic converter circuit to follow rapid changes of voltage even in the lower range of level of an input voltage, thus providing a more accurate display of the characteristics of the object mentioned hereinbefore to be measured.

Figure 4:
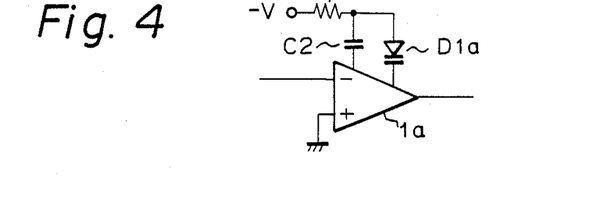
FIG. 4 is a schematic diagram illustrating a second embodiment of the logarithmic converter circuit to which the variable phase compensating apparatus is applied in accordance with the present invention, wherein only an altered portion of the circuit in FIG. 2 is shown.

The second embodiment will now be described by referring to FIG. 4 which shows only a modified portion to be effected on the logarithmic converter circuit shown in FIG. 2. This second embodiment can be used with an operational amplifier 1a of the type in which one of the phase compensation terminals has a voltage level varying in the same manner as that of the output voltage. The modification is made by omitting the capacitor C3 and the resister R2 in FIG. 2 and connecting the cathode of the variable capacitance diode D1a directly to the one of the phase compensation terminals. With the second embodiment, such frequency characteristics as shown in FIG. 3 are established, and thus the same advantage as that of the first embodiment is attained.

Figure 5:
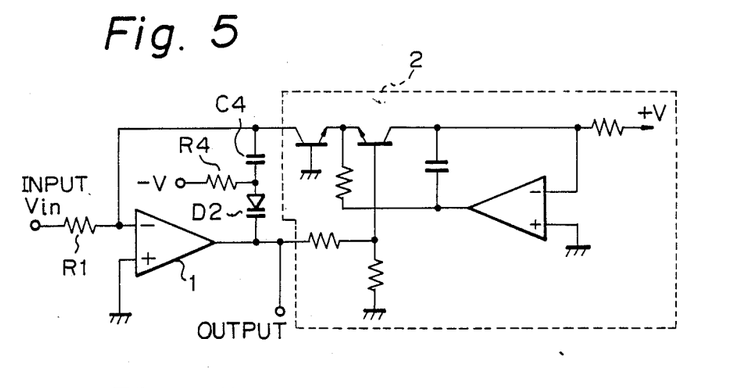
FIG. 5 is a schematic diagram illustrating a third embodiment of the logarithmic converter circuit to which the variable phase compensating apparatus is applied in accordance with the present invention.

FIG. 5 shows a third embodiment of the type in which a phase compensation is performed in the feedback path. The logarithmic converter circuit in FIG. 5 is different from the conventional circuit in FIG. 6 in that the fixed capacitor C1 is replaced with a fixed capacitor C4 and a variable capacitance diode D2 which are connected between the output terminal and the non-inverting input of the operational amplifier 1. The diode D2 has an anode connected to −V voltage supply via a resister R4.

The arrangement of the diode D2 having the opposite terminals being connected to the output terminal and the −V voltage supply via the resister R4, respectively, constitutes the phase-shift condition detecting means mentioned above, while the capacitor C4 and the variable capacitance diode D2 forms the variable phase shifting means. Since the capacitance of the variable capacitance diode D2 varies in response to the varied level of the output voltage (or input voltage) of the amplifier 1 in the same manner as the circuit in FIG. 2, the amount of phase shift of the circuit is continuously varied as the level of the voltage continuously changes. Thus, with the third embodiment, frequency characteristics on gain and phase similar to those shown in FIG. 3 are obtained, and therefore improvements of the circuit as shown in the solid lines in FIGS. 9 and 10 are provided.

With the variable phase compensating apparatus according to the present invention, a variable phase compensation is afforded to variable amplifier circuits the gain of which is controlled to continuously vary as the level of an input signal changes, thereby improving the frequency characteristics such as gain characteristics and phase characteristics of the variable amplifier circuit.

What is claimed is:

1. A variable phase compensation apparatus for making phase compensation for a feedback amplifying circuit which includes an input terminal for receiving an input signal having a level within a predetermined range of level and has a gain setting varying in response to the level of the input signal to generate an output signal, and which has frequency characteristics on gain and phase varying as the gain setting varies, said variable phase compensation apparatus comprising:
   a. phase shift condition detecting means for detecting the level of said input signal to generate a signal defining an amount of phase shift depending upon the level detected; and
   b. variable phase shifting means connected in a signal path in the feedback amplifying circuit and connected to receive said signal for defining the amount of phase shift, for phase shifting a signal in the signal path by an amount corresponding to said signal for defining the amount of phase shift, whereby a frequency range in which there is a substantially constant gain with respect to any given level of the input signal.

2. An apparatus of claim 1, wherein said feedback amplifying circuit is a logarithmic converting circuit for logarithmically converting an input signal to generate a logarithmic output signal having a level, said logarithmic converting circuit comprising:
   a. amplifier means having said input terminal for receiving said input signal, and an output terminal for generating said logarithmic output signal;
   b. feedback circuit means connected between said output terminal and said input terminal and functioning as a variable impedance having a value depending upon the level of the signal at said output terminal.

3. An apparatus of claim 2, wherein said phase-shift condition detecting means is operative to detect the level of the input signal from the level of the signal at the output terminal.

4. An apparatus of claim 3, wherein said variable phase shifting means includes variable capacitance means connected in parallel with the feedback circuit means and between the output terminal and the input terminal.

5. An apparatus of claim 4, wherein said variable capacitance means comprises a combination of fixed capacitor means and a variable capacitance diode, and wherein said phase-shift condition detecting means is operative to apply the variable capacitance diode with a bias voltage having a value depending upon the level of the signal at said output terminal.

6. An apparatus of claim 3, wherein said amplifier means includes an operational amplifier, said variable phase shifting means including variable capacitance means for phase compensation of the operational amplifier.

7. An apparatus of claim 6, wherein said variable capacitance means comprises a combination of fixed capacitor means and a variable capacitance diode, and wherein said phase-shift condition detecting means is operative to apply the variable capacitance diode with a bias voltage having a value depending upon the level of the signal at said output terminal.

8. A logarithmic converting circuit for logarithmically converting an input signal having a level within a predetermined range of level to generate a logarithmic output signal having a level, said logarithmic converting circuit comprising:
   a. amplifier means having an input terminal for receiving said input signal, and an output terminal for generating said logarithmic output signal, said amplifier means having a gain setting;
   b. feedback circuit means connected between said output terminal and said input terminal for functioning as a variable impedance having a value depending upon the level of the signal at said output terminal so as to vary the gain setting of said amplifier means;
   c. phase-shifting condition detecting means for detecting the level of said input signal to generate a signal defining an amount of phase shift depending upon the level detected; and
   d. variable phase shifting means connected in a signal path of said amplifier means and said feedback circuit means and connected to receive said signal for defining the amount of phase shift, for phase shifting a signal in the signal path by an amount corresponding to said signal for defining the amount of phase shift, whereby a frequency range in which there is a substantially constant gain with respect to any given level within said predetermined range of level of the input signal.

9. A logarithmic converting circuit of claim 8, wherein said phase-shift condition detecting means is operative to detect the level of the input signal from the level of the signal at the output terminal.

10. A logarithmic converting circuit of claim 9, wherein said variable phase shifting means includes variable capacitance means connected in parallel with the feedback circuit means and between the output terminal and the input terminal.

11. A logarithmic converting circuit of claim 10, wherein said variable capacitance means comprises a combination of fixed capacitor means and a variable capacitance diode, and wherein said phase-shift condition detecting means is operative to apply the variable capacitance diode with a bias voltage having a value depending upon the level of the signal at said output terminal.

12. A logarithmic converting circuit of claim 9, wherein said amplifier means includes an operational amplifier having phase compensation terminals, said variable phase shifting means including variable capacitance means connected between the phase compensation terminals of the operational amplifier.

13. A logarithmic converting circuit of claim 12, wherein said variable capacitance means comprises a combination of fixed capacitor means and a variable capacitance diode, and wherein said phase-shift condition detecting means is operative to apply the variable capacitance diode with a bias voltage having a value depending upon the level of the signal at said output terminal.

* * * * *